United States Patent
Lind et al.

(10) Patent No.: US 8,753,447 B2
(45) Date of Patent: Jun. 17, 2014

(54) HEAT SHIELD FOR HEATER IN SEMICONDUCTOR PROCESSING APPARATUS

(75) Inventors: Gary Lind, Los Gatos, CA (US); John Floyd Ostrowski, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 1051 days.

(21) Appl. No.: 12/482,042

(22) Filed: Jun. 10, 2009

(65) Prior Publication Data

US 2010/0317197 A1 Dec. 16, 2010

(51) Int. Cl.
*C23C 16/00* (2006.01)

(52) U.S. Cl.
USPC .............. 118/725; 118/723 VE; 427/576

(58) Field of Classification Search
None
See application file for complete search history.

(56) References Cited

U.S. PATENT DOCUMENTS

| | | | |
|---|---|---|---|
| 5,124,101 A * | 6/1992 | Hirao et al. | 264/82 |
| 5,443,647 A | 8/1995 | Aucoin et al. | |
| 5,476,548 A | 12/1995 | Lei et al. | |
| 5,532,458 A | 7/1996 | Kratel et al. | |
| 6,051,286 A * | 4/2000 | Zhao et al. | 427/576 |
| 6,150,643 A | 11/2000 | Kitamura et al. | |
| 6,205,648 B1 | 3/2001 | Hughes | |
| 6,399,000 B1 | 6/2002 | Carr | |
| 6,921,506 B1 | 7/2005 | Mitchell et al. | |
| 7,444,805 B2 | 11/2008 | Zuberi et al. | |
| 2009/0029308 A1 | 1/2009 | Ishihara et al. | |

OTHER PUBLICATIONS

Caps, R. et al. Thermal coductivity of opacified powder filler materials for vacuum insulations, 2000, vol. 21(2), pp. 445-452.*
Microtherm Group, retrieved from internet site: http://web.archive.org/web/20060814230856/http://www.microthermgroup.com/site/index.asp?l=11.*
"From Cold to Hot Insulation Needs We've Got You Covered", Aspen Aerogels Inc., 2008, 4 pages, Rev. 2.0 [pamphlet].
"Microtherm Machined Products Precision machined high temperature components" Microtherm Inc., Issue reference No. 121108/02, 2 pages [pamphlet].
George Gloud, "Aspen Aerogels, Proxygel XT: Aerogel Insulation Designed for High Temperature Industrial Applications", Aspen Aerogels Inc, Oct. 17, 2008, 22 pages.
Zicar Ceramics, "Microsil Microporous Insulation" [online], [Retrieved on Apr. 6, 2009]. Retrieved from the Internet: <URL: http://www.zircarceramics.com/pages/microporusinsulation/microporous.htm>.
"Microtherm Standard Block High Temperature Microporous Insulation" Microtherm Inc., Issue reference No. 1211108/02, 2 pages [pamphlet].

* cited by examiner

*Primary Examiner* — Robert Xu

(57) ABSTRACT

A heat shield employed in semiconductor processing apparatus comprises a high performance insulation that has low thermal conductivity, such as, below the thermal conductivity of still air over a wide range of temperatures utilized in operation of the apparatus. As an example, the thermal conductivity of the insulation may be in the range of about 0.004 W/m·h to about 0.4 W/m·h over a temperature range of about 0° C. to about 600° C. or more. The deployment of the high performance heat shield reduces the power consumption necessary for the heater by as much as 20% to reach a desired processing temperature as compared to a case of heater power consumption required to reach the same desired temperature without the shield. Further, the heat shield significantly reduces the amount of undesired depositions from gas-entrained constituents on components in the chamber of the apparatus, particularly below or beyond the heat shield, by as much as 90% since the temperature drop is as much as ten orders of magnitude difference.

4 Claims, 4 Drawing Sheets

HEAT SHIELD FOR HEATER IN SEMICONDUCTOR PROCESSING APPARATUS

BACKGROUND

A. Technical Field

The present invention relates generally to semiconductor processing and semiconductor processing apparatus and more particularly to improvements in the efficiency in the use and operation of semiconductor processing apparatus.

B. Background of the Invention

There is an initiated and ongoing trend in the development of semiconductor processing apparatus, particularly to improve their efficiency of operation and operate more "green" with less detrimental effects on the environment. That trend includes steps of going more "green" in the operation of such apparatus, such as, reducing the power consumption of the apparatus and reducing the required time and the amount of expense necessary to clean the apparatus between production runs. Examples of such apparatus are the heat treatment and deposition of various kinds of materials and/or layers on a workpiece, which may be a semiconductor wafer or any other type, and kind of substrate to be heated, treated and/or deposited with different types of film. The process employed for heat treatment is generally annealing of the workpiece as known in the art. The processes employed for depositing film layers may be, for example, chemical vapor deposition (CVD), physical vapor deposition (PVD) and plasma-enhanced chemical vapor deposition (PECVD) as known in the art. A particular CVD process used extensively today is the deposition of tungsten films on a workpiece, such as, for example, from a gas-entrained constituent comprising tungsten hexafluoride ($WF_4$). These kinds of semiconductor processing apparatus are generally run continuously until required maintenance becomes necessary and production must cease and the apparatus is cleaned with a dry or wet cleaning gas process or the apparatus chamber is opened for extensive cleaning of it interior.

Some of the problems being sought to be solved at the present time are the prevention of corrosion and depletion of the workpiece platen assembly and heater surfaces caused by repeated cleanings, and the reduction of undesired depositions from deposition gases on surfaces of the apparatus chamber, including the pedestal assembly for the workpiece, which depositions can affect the operation of the apparatus and can result in frequent cleaning of surfaces exposed to these unwanted depositions within the chamber. In most cases, these undesired depositions are on the chamber walls of the apparatus as well as exposed surfaces of the pedestal assembly and its stem within the chamber. These unwanted depositions also include poorly bonded depositions on pedestal surfaces, which may readily flake off and may cause defects in the workpiece. Moreover, these depositions can affect the formation of the plasma in the chamber causing uneven deposition of a deposited film on the workpiece and may degrade the operation of components in the apparatus chamber. Even in the case of heat treatment of workpieces, such as in annealing where no film deposition is involved, poorly bonded depositions on chamber components may become more active due to high chamber temperatures and become dislodged and, possibly, contaminate the workpiece undergoing treatment. Thus, it is necessary to provide frequent cleaning of the apparatus chamber, which requires the stopping of workpiece production and the passing of a cleaning gas through the chamber that provides reactant species that react with the undesired depositions and etch away the depositions from the chamber or pedestal/stem surfaces that are then exhausted and removed from the chamber. Also, periodically, it is necessary to open the chamber and accomplish a more thorough cleaning of chamber walls and component surfaces exposed to deposition gases flowing through the apparatus. Thus, cleaning time becomes a major factor in reducing the total time of operating the apparatus in the production of workpiece output. What is needed are ways of increasing the workpiece production output and decreasing the time spent cleaning the apparatus chamber and pedestal assembly thereby increasing the overall rate of workpiece output production per month.

Many apparatus have platen surfaces on heaters where the heater bodies are made of aluminum, although some may be made of ceramics. These types of heater bodies are resistant to the corrosive effect of deposition gases. However, the heater surfaces are etched away during the cleaning of the apparatus in the process of removing unwanted depositions that may be on its surfaces. Thus, over time, it becomes necessary to replace the heater. What is desired, then, is to reduce or eliminate this undesired etching away of the metal heater body and, further, provide a replacement heater for existing semiconductor processing apparatus that is more resistant to undesired etching away of the metal heater body over time during the chamber cleaning processes.

In summary, what is needed is an improvement to workpiece production rate in continuously operated semiconductor processing equipment by reducing the amount of time required to clean the apparatus chamber which, in turn, will also reduce the amount of consumables required in the cleaning process, resulting in a "greener" operating apparatus.

SUMMARY OF INVENTION

According to this invention, a novel approach is employed in a semiconductor processing apparatus where a high performance heat shield is employed in conjunction with a heater and workpiece platen assembly where the heat shield insulation has low conductivity over a wide range of temperatures so that a significant amount of heat is redirected from the heat shield back to the heater to heat up the workpiece. As a result, a substantial savings in heater power consumption is achieved since the power required to heat the workpiece to a given temperature is now significantly reduced. Tests have shown that a reduction in power consumption of about 20% or more is achieved with a heater in semiconductor processing apparatus utilizing the high performance heat shield of this disclosure.

Another feature of this invention is deployment of a heat shield having high performance insulation in a semiconductor processing apparatus employed for depositing films on workpieces, for example, chemical vapor deposition (CVD). The high performance heat shield provides a large temperature differential between a first side of the heat shield, next to or associated with the heater, relative to a second side of the heat shield, next to or associated with a remaining portion of the pedestal. In a film deposit processing apparatus, the amount of undesired depositions on chamber components, including the stem and pedestal, is significantly reduced because temperature levels required for deposition via gas-entrained constituents is deterred beyond the second side of the high performance heat shield, i.e., the side opposite to that in thermal communication with the heater body, since the temperature is not sufficiently high to readily permit a film deposition process. As an example, the temperature differential may be as much as four times or more between one side and the other side of the high performance heat shield.

An example of a typical cleaning gas for this type of apparatus may be the use of a plasma-generated source from a remote plasma source (RPS) at the top of and outside of the chamber. A cleaning gas, such as nitrogen fluorine ($NF_3$), is provided in the chamber where the pedestal is heated to a temperature of about 300° C. to 400° C. which causes dissociation of the fluorine atoms from the gas to form an active fluorine (atomic) species to clean unwanted depositions from the surfaces of the chamber pedestal or pedestals. These unwanted depositions are on surfaces of the pedestal that are subjected also to receive a deposited film from gas-entrained constituents during the deposition of films on a workpiece present on the pedestal platen. However, as these cleaning species move toward the bottom of the chamber, the fluorine atoms readily combine into fluorine molecules that are far less effective in active cleaning (etching). As a result, in regions below the heater in the apparatus chamber, longer periods of cleaning time via a cleaning gas flow is required in order to clean these regions of all unwanted depositions. However, in the case of the presence of a high performance heat shield of this invention, these unwanted depositions are 10 orders of magnitude less than unwanted depositions in the case of absence of such a heat shield so that their removal can be achieved in a much shorter period of time, even in the presence of cleaning species that are less reactive, such as being more molecular in nature. In other words, there are less atomic species for high rate cleaning in lower parts of the apparatus chamber below the high performance heat shield but there is also present less undesired depositions on these lower parts due to the presence of the high performance heat shield. Thus, the cleaning time between production runs of the apparatus is reduced. Correspondingly, there is an increase in the amount of time that can be devoted to production runs resulting in an overall improved throughput of workpieces per unit time. Also, through modeling, it has been shown that the improvement in workpiece throughput versus cleaning time between production runs is greater in the case of the deposition of thicker films on the workpiece. This is due to a reduction in overall cleaning time through the employment of the high performance heat shield of this invention, which provides for more time for depositing thicker films.

The high performance heat shield of this invention comprises a thermal insulator that has maintained low values of thermal conductivity over a wide range of temperatures. In particular, the thermal conductivity over the temperature remains fairly uniform compared to other better-known thermal insulators and remains below the thermal conductivity of still air over the temperature range. Other known thermal insulators employed in the past have a thermal conductivity range that significantly rises with increasing temperature over a comparable temperature range. For example, the thermal conductivity of the high performance insulation may be in the range of about 0.004 W/m·h to about 0.4 W/m·h over a temperature range of about 0° C. to about 600° C. or more. Other conventional used insulation materials, such as, for one example, cellular glass, extend above a thermal conductivity of 1.0 W/m·h for temperatures above 400° C. Among the choices for high performance insulation useful in this invention are Microtherm®, Microsil®, and silica aerogels.

According to a further feature of this invention, the heat shield may be a separate component from the heater or may be an integral part of the heater body. In one version, the high performance heat shield insulation is a separate component and may be enclosed or housed in a metal container. The container may be vented so that the atmosphere within the insulation-filled container may be evacuated while in the apparatus chamber. In another version, the heat shield may be embedded within the same body as the heater body. In either version, the heat shield may also extend laterally up at the heater edges to surround the sides of the heater as well as extending along a longitudinal side of the heater on a heater side opposite to the platen assembly. The heater body may be, for example, aluminum or ceramic as known in the art.

Another feature of this invention is the formation of purge paths within the interior of the pedestal assembly where a purge gas is introduced through the pedestal stem into passages or paths between the pedestal components and then exit out into the apparatus chamber. The purpose of the purge paths is to prevent both the deposition gases and cleaning gases from entering into the interior of the pedestal assembly. This, in turn, permits the use of metals in pedestal parts that can be corroded or attached by such gases since these gases are not permitted to enter these passages or paths due to the pumped purge gas along the paths.

In a further feature of this invention, the high performance heat shield may include on one or more of its longitudinal surfaces a pattern of protrusions, such as, for example in the metal container surface adjacent to the heater body on the pedestal. Alternatively, the pattern of protrusions may be formed on the heater body longitudinal surface adjacent to the heat shield. A pattern of protrusions may also be formed on the opposite longitudinal surface of the heat shield in engagement with the pedestal base. In either case, the protrusions aid in forming and maintaining a gas purge path between the surfaces of the heat shield and the adjacent heater body and pedestal base through which a purge gas passes and exits into the apparatus chamber. The protrusions for diversion and diffusion of the purge gas flow to be more uniform and evenly distributed to it s point of exit into the chamber. Thus, these protrusions also ensure that there is a uniformly maintained gap between the heater body and heat shield surfaces so that a purge gas path is formed between these two surfaces where the purge path extends out in a unidirectional manner to the side edges of the heater body and heat shield and provide for flow into the apparatus chamber. These protrusions may be comprised of dimples or ridges formed in one or more surfaces of the heater body and the heat shield.

Also, the deployment of the pattern protrusions provide for the minimal physical and, therefore, direct thermal contact between the surface of the heater body and the heat shield or the heat shield and the pedestal base so that the metal-to-metal contact between these components is minimized to further reduce thermal conduction from the heater to the pedestal base.

In a further feature of this invention, the pedestal stem may be employed as a cooling mechanism cooling down the semiconductor processing apparatus at a faster rate to permit the commencement of a cleaning or maintenance process. The pedestal stem is hollow forming a cavity that is exposed to the exterior of the semiconductor processing apparatus via an opening at the bottom of the stem. A gas supply is provided within the stem cavity, preferably adjacent its inner end, to supply and circulate the gas within and throughout the cavity to carry away heat and exit through the cavity opening. Thus, the gas flowing along its surface and out of the cavity opening rapidly cools the hot inner stem wall and, in turn, rapidly cools the apparatus chamber.

The cooling effect on the stem cavity is further enhanced by the presence of other pre-existing metal supply tubes and other metal members fixed within the stem cavity and connected at the inner end of the cavity to the bottom of the pedestal so that these tubes and members also function as heat dissipating fins. The cooling gas may be compressed air, an inert gas or other coolant gas to help cool the stem and the chamber by transferring heat away from the stem cavity walls and the supply tube surfaces. It is within the scope of this feature to provide a pedestal stem cavity with an array of cooling fins attached to its inner surface to provide for even more effective cooling.

The above-mentioned cooling feature provides for faster cool down and is particularly important in combination with the high performance insulation so that, in general, the apparatus is going to be able to cool down at a much faster rate to achieve quicker access to the apparatus chamber for cleaning maintenance. In practice, the deployment of stem cooling as taught in this disclosure provides for cooldown from chamber temperature of about 400° C. to about 100° C. in about one hour's time. Without this cooling feature, the cooldown of the same apparatus takes several hours.

Another feature of this invention is a pedestal assembly comprising a workpiece platen, heater and heat shield supported on a stem, which assembly is a replaceable pedestal assembly that may be deployed in older semiconductor processing apparatus to improve the apparatus efficiency relative to both power consumption and workpiece throughput per unit time.

BRIEF DESCRIPTION OF THE DRAWINGS

Reference will be made to an exemplary embodiment of the present invention that is illustrated in the accompanying figures. Those figures are intended to be illustrative, rather than limiting. Although the present invention is generally described in the context of that embodiment, it is not intended by so doing to limit the scope of the present invention to the particular features of the embodiment depicted and described.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiment of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

Reference in the specification to "one embodiment" or to "an embodiment" means that a particular feature, structure, characteristic, or function described in connection with the embodiment is included in at least one embodiment of the present invention. The appearance of the phrase "in one embodiment" in various places in the specification does not necessarily constitute plural references to a single embodiment.

"Semiconductor processing apparatus" is intended to cover all apparatus employed in the manufacture of semiconductor chips and devices generally formed in a workpiece including, but not limited to, processes for annealing, heat treatment, film deposition, etching, metal deposition, metal plug processing, etc. and any other such apparatus for treatment of workpieces in a vacuum or pressurized or gas-supplied chamber of the apparatus using high temperature to perform a process step in the treatment, deposition or modification of the workpiece. The "workpiece" may be a wafer or substrate, such as silicon or Ill-V semiconductor wafers, or a sub-form of such a wafer or substrate.

Figure 1:
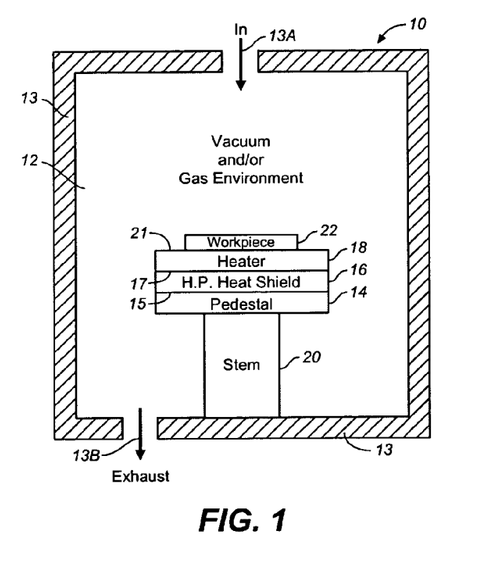
FIG. 1 is a schematic cross-sectional, diagrammatic view of a first embodiment of a high performance heat shield of this invention in a semiconductor processing apparatus.

Reference is now made to FIG. 1 which illustrates in schematic form a semiconductor processing apparatus 10 that includes a chamber 12, formed by walls 13, and within which is pedestal assembly 14 supported on stem 20 secured to a wall 13 of chamber 12. Pedestal 14, as known in the art, supports a heater 18 having a platen assembly that includes workpiece platen surface 21 on heater 18 to support a workpiece 22 to undergo treatment or film deposition in chamber 12. The platen surface 21 may be part of the heater top surface or a separate platen assembly on the heater surface but the platen configuration is not directly pertinent to this invention.

High performance (H. P.) heat shield 16 of this invention is provided between pedestal 14 and heater 18 and is made from a high performance insulation material that provides a relatively continuous low thermal conductivity over a wide range of temperatures provided by heater 18. As one example, the thermal conductivity is below that of still air over a wide temperature range. As a further example, the thermal conductivity is at or below 0.4 W/m·h over an extended temperature range. By employing such a high performance heat shield 16 below the apparatus heater 18, several advantages are achieved. First, a significant amount of heat transfer from heater 18 to heat shield 16 is greatly reduced because the high performance insulation provides for a minuscule or insignificant level of any heat transfer to shield 16, whether by thermal conduction, convection or radiation. Thus, the heat transfer that could have been transferred from the bottom of heater 18 to pedestal 14 and stem 20 is more readily directed to workpiece 22 supported on heater 18. With this increase in heat provided to workpiece 22, the electrical power consumption of heater 18 can be reduced to reach the same processing temperature providing a significant power savings in heater operation over the lifetime of the heater. Simulated and actual tests have shown that with the deployment of a high performance heat shield 16 in combination with heater 18, as shown in FIG. 1, a power reduction of about 20% or more can be realized in the operation of heater 18.

Second, relative to film deposition on a workpiece 22 in a semiconductor processing apparatus 10, the employment of high performance heat shield 16 provides for a high temperature differential between a first side 15 of heat shield 16 associated with first components comprising pedestal 14 and stem 20, portions of which may be exposed to deposition gases within chamber 12, and a second side 17 of heat shield associated with second components comprising heater 18 and platen 21. The surface temperatures of the first components have been shown to be approximately ten orders of magnitude lower than surface temperatures of the second components due to the employment of high performance heat shield 16. As a result, as much as a 90% in temperature difference may be experienced between the first and second components due to high performance shield 16. The significantly lower temperatures at the first components means that unwanted depositions of gas-entrained constituents will be significantly reduced because the temperatures at these first component surfaces is not sufficiently high to readily permit deposition of an unwanted film or depositions through dissociation of gas-entrained constituent species from the deposition gas.

Third, because a significant reduction of unwanted depositions from the deposition gas is achieved on the above mentioned first components during semiconductor production runs, a reduction in cleaning time of chamber 12 can also be realized, resulting in more apparatus time devoted to semiconductor production runs and an increase in workpiece throughput per unit time. As an example, cleaning of chamber 12 is generally carried out by employing an etching gas, such as nitrogen triflouride ($NF_3$), that contains reactant species to etch exposed surfaces in chamber 12 particularly of the pedestal 14, heater 16 and platen 21 as well as any chamber exposed portions of stem 20, if any, exposed to a gas-entrained constituents. A particular example of such constituents is tungsten (W) deposited from a deposition gas, such as tungsten triflouride ($WF_3$) supplied via inlet 13A (which, for example, may include a "shower head" at the inlet) to chamber 12 during a semiconductor production run. The cleaning time reduction comes about from the comparatively decreased amount of depositions on the above-mentioned first components deposited during a semiconductor production run due to lower established and maintained temperatures at these components due to the presence of high performance heat shield 16. As previously indicated, there are less unwanted depositions because the deposition temperatures have not been even closely achieved at these first mentioned components. This translates into less time required with an etching gas, such as $NF_3$, to remove smaller amounts of unwanted deposited depositions on the surfaces of these first mentioned depositions.

Moreover, the larger amount of unwanted depositions will be on exposed surfaces of the second mentioned components that are nearer the input of the cleaning gas. When these surfaces are subjected to an etch plasma in chamber 12 generating active fluorine species, the unwanted film and depositions are quickly removed through exhaust 13B. Consequentially, less active fluorine species are available to the first mentioned components, beyond or below the second mentioned components. However, there are, now, less amounts of depositions to be removed so that the overall removal of unwanted depositions from the surfaces of in-chamber exposed pedestal parts can be accomplished much more quickly compared to the same apparatus that does not contain high performance heat shield 16. The overall result is a "greener" cleaning process in that less etching gas per unit time is require to complete the chamber/pedestal cleaning task which means that less toxin gas is expended to complete the cleaning process.

Fourth, increased life expectancy of the pedestal and heater is realized since less etching time is required to clean away unwanted depositions from these components. It should be realized that with each cleaning cycle of apparatus 10, a small micro-amount of the metal surfaces of the exposed stem, pedestal base, heater and platen assembly and its workpiece surface will be etched away. By reducing the amount of unwanted depositions in these regions of the chamber, the overall amount of cleaning time is reduced which means that less time is expended to the etching exposure of these components to fluorine species.

Figure 2:
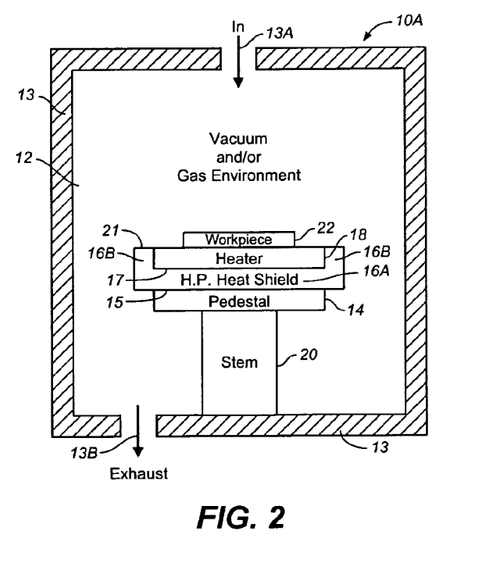
FIG. 2 is a cross-sectional, diagrammatic view of a second embodiment of a high performance heat shield of this invention in a semiconductor processing apparatus.

Reference is now made to the embodiment shown in FIG. 2, which is similar to the first embodiment of FIG. 1 except for the geometry of heat shield 16A is different. High performance (H. P.) heat shield 16A has a lip or edge 16B that encloses or surrounds the lateral or side edges of heater 18 as well as the heater bottom surface. In the case here, the two-sided enclosure of heater 18 further enhances the redirection of heat from heater 18, due to the presence of high performance heat shield 16A, to workpiece platen 21. A further decrease in power consumption required by heater 18 is realized through the employment of this wrap-around high performance heat shield design.

Figure 3:
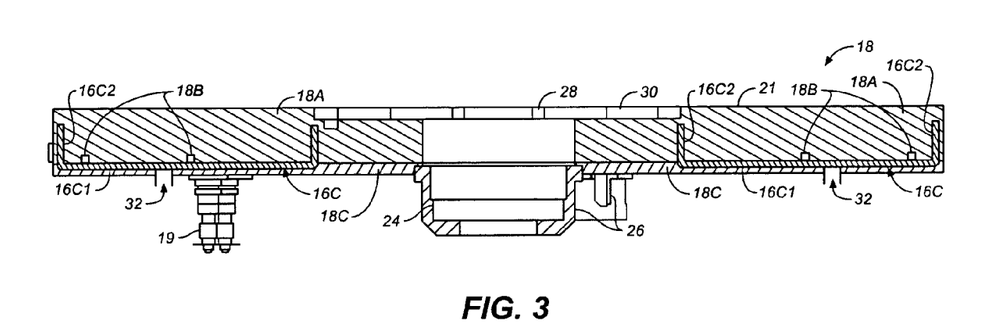
FIG. 3 is a cross-sectional, diagrammatic view of a third embodiment of a high performance heat shield of this invention in a semiconductor processing apparatus.

Reference is now made to the embodiment shown in FIG. 3. Heater 18 comprises a heater body 18A within which are embedded high performance heat shield 16C, heater elements 18B and a platen surface 21, the latter formed on the surface of heater 18. Heater 18 is supported on a hub 24 that includes alignment features 26 for the alignment of heater body 18A on a pedestal (not shown). Heater elements 18B have connection couplers 19 for providing power to the heater elements. Heater elements 18B may be standard heating elements as known in the art, such as incolnel, and are embedded in grooves formed in heater body 18A and enclosed and sealed with heater body portion 18C. Below these heater elements 18B is embedded high performance heat shield 16C that has a C-shape form comprising bottom side 16C1 and side edges 16C2, which encompass heating elements 18B. Platen surface 21 includes apertures 28 and grooves 30 for providing a purge gas to the underside of the workpiece as known in the art. As a specific example, the heater body 18A may be comprised of aluminum, such as aluminum alloy 6061, preferably aluminum with purity greater than 95%. Such aluminum is more resistant to the corrosive effects of the cleaning gases. As a specific example, heater body 18A may be approximately 4 inches thick and the embedded high performance insulation heater shield 16C may be approximately one-quarter inch thick. The high performance insulation for shield 16C is available in sheet form, such as Microtherm®, and may be fabricated from a sheet to form shield bottom side 16C1 which is disk-shaped member, and shield sides 16C2 are formed as ring-shape members.

Also, vent apertures 32 may be formed through and into heater body 18A and exposed high performance heat shield 16C to the ambient of chamber 13. Utility of these vents will be referred to later in more detail in another embodiment.

Figure 4:
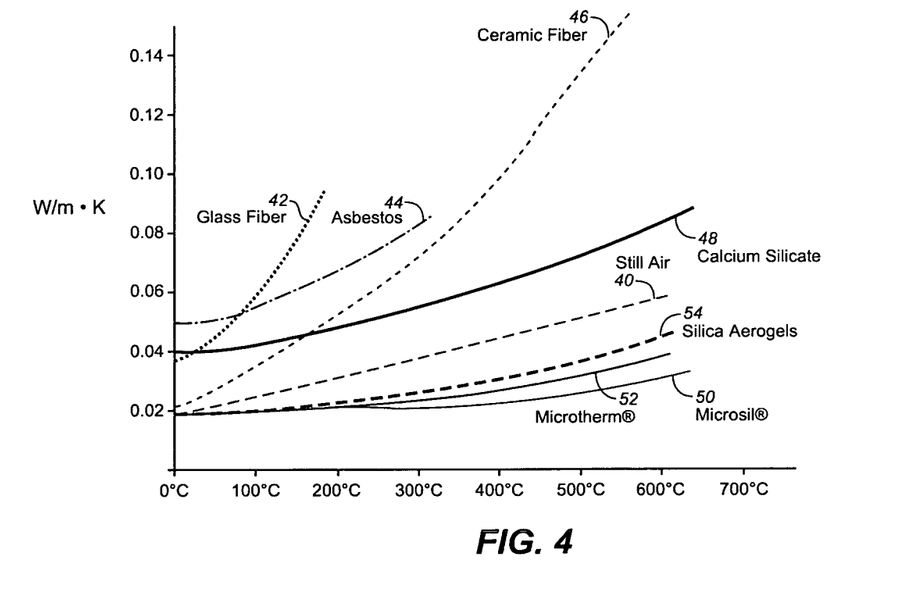
FIG. 4 is a graphic illustration of the thermal conductivity of various insulations including high performance insulation for the heat shield described and claimed in this disclosure.

Reference now is made to the graphic illustration in FIG. 4, which illustrates the thermal conductivity properties in W/m·h of various insulation materials over a wide range of temperatures, e.g., 0° C. to about 700° C. including the high performance insulation materials desired for use in this invention. Central to this figure is the thermal conductivity of still air shown at dashed line 40 that increases fairly proportionately with increasing temperature. Other known insulating materials such as glass at 42, asbestos at 44, ceramic at 46 and calcium silicate at 48 significantly rise in value from 0° C. to values well above that at still air at 40. However, high performance insulation, such as Microsil® at 50, Microtherm® at 52 and silica aerogels at 54 provide a much more uniform level of thermal conductivity with little increase over a wide range of temperatures, such as, for example, from about 0° C. to about 700° C. and more, compared to the other insulating materials 42, 44, 46 and 48. Also Microsil®, Microtherm® and silica aerogels do not exceed the thermal conductivity of still air over the same temperature range. Said another way, the desired thermal conductivity properties of high performance insulation is at or below 0.04 W/m·h over a wide temperature range which includes processing temperature utilized in semiconductor processing apparatus 10 and 10A. While any known material below this thermal conductivity value may be termed high performance insulation, we have found that the thermal conductive properties of Microtherm®, Microsil® and aerogels, such as silica aerogels, are presently preferred.

Aerogel is a solid-state material with the lowest density; it is derived from gel in which the liquid component of the gel has been replaced with gas. The result is an extremely low-density solid with several remarkable properties, most notably its effectiveness as a thermal insulator. Such aerogel insulation, e.g., Pyrogel® XT, is available from Aspen Aerogels, Inc., 40 Forbes Road, Northborough, Mass. 01532.

Another suitable high performance insulation is Microsil®. Microsil® is a microporous silica thermal insulation areogel that has low density, which minimizes conductive heat transfer, and includes nano-pockets, voids or micropores that block convection and reflect heat energy back to the heat source, such heater 18. The insulation is a combination of ultrafine silica powders, specially processed refractory oxides and glass and is manufactured by and available from ZIRCAR Ceramics, Inc., 100 North Main Street, PO Box 519, Florida, N.Y. 10921. In particular, silica (silicon dioxide) aerogels consist of bonded silicon and oxygen atoms joined into long strands and then into beads randomly linked together with pockets of air between them. Silica aerogels are an amorphous form of "common sand", nonflammable, nontoxic, and environmentally safe. These aerogels can be made less dense than air when the air micro-pores are removed and are about more than 30 times lighter than previously known aerogels. Using a two-step condensed silica process, ZICAR Ceramics, Inc. has produced one of the lightest aerogels ever made that contains 99.98% air.

A further suitable high performance insulation is Microtherm® available from Microtherm Inc. U.S.A., (parent, Microtherm Ltd., Great Britain), 3269 Regal Drive, Alcoa, Tenn. 37701. Microtherm® is opacified blend of filament reinforced silica which is stable even to temperatures as high as 1000° C. and is available in microporous sold sheet form which may be easily cut, shaped and formed into a high performance heat shield 16 or 16C as illustrated in FIGS. 1 and 2. More details will be discussed later about Microtherm® insulation.

From the foregoing description, it should be realized that porous insulation materials are best suited as a high performance heat shield 16 or 16C in the semiconductor processing apparatus 10, such as is in the case of Microsil®, Microtherm® and silica aerogels. This is because all of these microporous insulation materials are designed to provide maximum resistance to all modes of heat transfer. Solid thermal conduction, gaseous conduction and radiation are all kept to an absolute minimum because of the presences of the micro-pores in the material. Thermal convection cannot occur in a microporous material due to the absence of sufficiently large air volumes. They are good convective inhibitors because air cannot circulate throughout the microporous lattice of the insulation. Solid thermal conduction is very effectively minimized in three ways. Approximately 90% of the volume is void space where only less efficient gaseous conduction can take place. The nano-sized particles making up high performance insulation have very restricted contact with one another, limiting thermal pathways (note that amount of heat conducted is directly proportional to the cross section of the conduction path). The heat paths through the solid matrix are very tortuous, and, therefore, long. This decreases the rate at which heat can flow by solid thermal conduction (note that the amount of heat conducted is inversely proportional to the length of the conduction path). Gaseous thermal conduction is restricted by the porous effect. This is unique to these microporous insulations and is the property that gives these high performance-insulating materials their small step-change decrease in thermal conductivity over conventional insulations.

The above mentioned microporous effect is the restriction of collisions between air molecules which leads to heat transfer. By ensuring that the voids in the insulating material are smaller than the mean free path of the air molecules (approximately 100 nm at atmospheric pressure), significant heat transfer is severely restricted. Under these circumstances, most of the collisions an air molecule experiences in the microporous insulation are within the walls of the micropores, a process that transfers little energy.

Aside from the use of high performance thermal insulation having micro-pores or being microporous, it should be noted that in some scientific definitions, "microporous" has reference to material having pores or voids less than 2 nm across. However, it should be realized that larger porosity insulation is within the scope of high performance insulations that may be utilized in this invention. As an example, therefore, "mesoporous" (pores or voids between 2 nm and 50 nm across) insulation and "macroporous" (pores or voids in excess 50 nm across) insulation are to be considered as comparable with "microporous" so that latter term is intended to cover these other possible dimensional porosities. Therefore, "porous", whether micro, meso or macro, means a material having minute spaces or voids. The use of the term, "microporous" in this disclosure is intended to cover porous insulation including microporous, mesoporous and macroporous insulation the meet the high performance insulation criteria discussed and disclosed in this application.

Thermal radiation is the major mode of heat transfer at higher temperatures. The previously discussed high performance insulations are formulated to be almost entirely opaque to infrared radiation. This means that the thermal conductivity rises only slightly with increasing temperature, as illustrated by porous insulation curves 50, 52 and 54 in FIG. 4, and their thermal performance advantages over conventional insulations, particularly with Microtherm® insulation, becomes more pronounced as the operating temperature increases towards 1000° C. (1832° F.) and higher.

In summary, it can be seen that the above-mentioned high performance porous insulations almost nullify the three thermal methods of heat transfer: conduction, convection and radiation. However, it should be noted that other high performance insulations meeting the criteria of high performance insulation as discussed and claimed in this application are also adaptable as high performance insulation for heat shields disclosed in the embodiments herein. Such insulations have a relatively uniform thermal conductivity level over a wide range of semiconductor processing apparatus operating temperatures such as, for example, a thermal conductivity level that remains below that for still air or, as a further example, a thermal conductivity that is generally at or below 0.04 W/m·h over a wide temperature range, such as, for example, 0° C. to about 700° C. or more as seen in FIG. 4.

Figure 5:
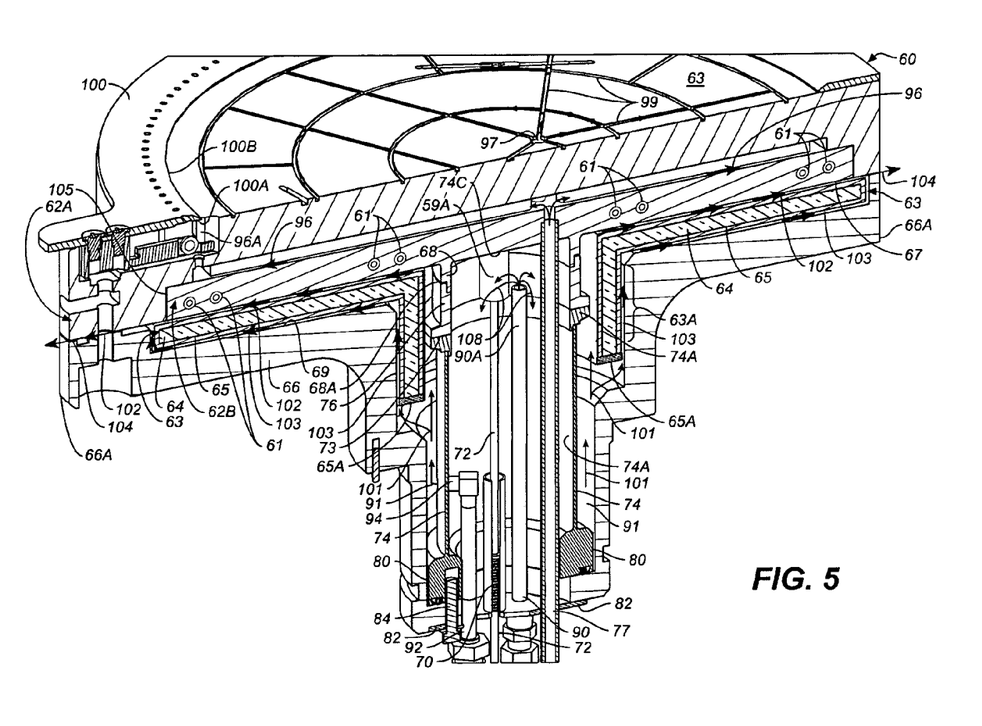
FIG. 5 is a cross-sectional, isometric view of a fourth embodiment of a high performance heat shield of this invention in a semiconductor processing apparatus.

Reference is now made to FIG. 5, which illustrates a detailed partially cross-sectional isometric view of another embodiment of this invention comprising pedestal assembly 60. Assembly 60 comprises heater body 62, comprising platen assembly 62A, heater 62B and platen surface 63 for supporting a workpiece. Several of such pedestal assemblies 60 may be provided in a single semiconductor processing apparatus. Heater body 62 is supported from a pedestal base 66 that supports and encompasses a high performance heat shield 63 between one surface 67 of heater body 62 and surface 69 of base 66. Base 66 is made of aluminum is made thicker to maintain cooler temperatures near its annular edge 66A. In this way, base 66 thermally conducts efficiently to the chamber, such as chamber 13, within which pedestal assembly 60 is mounted. Such a pedestal design provides a pedestal outer surface at 66A that is significantly lower than the temperature at workpiece platen 63. Also, it should be noted that there is no direct metal-to-metal contact between both, platen assembly 62A and metal heater 62B, and metal base 66 thereby reducing the amount of thermal conduction to components of pedestal assembly 60 below high performance heat shield 63. This is because there is a purge gas outlet 104 between the surfaces of platen assembly 62A and pedestal base 66 and an purge gas path 102 to outlet 104 between both, platen assembly 62A and metal heater 62B, and metal base 66, which purge gas path will be explained in more detail later.

As indicated above, heater body 62 comprises two portions 62A and 62B where portion 62A comprises a workpiece brazed platen assembly with platen surface 63 and portion 62B includes single zone inconlel-based heater elements 61 which are provided with electrical power via a heater electrical lead (not shown) provided through pedestal stem 74 to the bottom of heater assembly 62B. Thermocoupler assembly 72 is spring loaded at spring 70 to maintain the thermal sensor of the assembly up within an aperture in aluminum heater boss 59A of heater assembly 62B to monitor the temperature of heater 62 during semiconductor production processing. Heater body 62 may be ceramic or aluminum but is preferably of high aluminum purity, as previously indicated. In the case of aluminum, as illustrated here, the aluminum annular boss 68 of heater body 62B is welded to aluminum coupler 76. Coupler 76 is then bonded to stainless steel stem 74 at 73 via welded stainless steel coupler 74A to form a bi-metal union of aluminum bonded to stainless steel. The method of forming this union 73 may be explosive bonding, which is known in the art. Stem 74 is stainless steel because it has a lower thermal conductivity over that of aluminum forming heater body 62 so that the impact of thermal conductivity of heat from heater 62B to stainless steel stem 74 is minimized. Also, stainless steel stem 74 can be a thin sidewall or tube wall construction, which also reduces the amount of any thermal conduction of heat from heater 62A. The bottom of stem 74 includes a welded stainless steel hub or mounting end 80 and fasteners 84 are employed to secure a stainless steel end plate 82 to base hub 80 which also holds spring 70 under spring compression to maintain the mounting of thermocouple assembly 72 with its thermo sensor held secure in boss 59A.

A conduit or tube 77 shown in FIG. 5 is an exclusion gas line to platen assembly 62A to supply an exclusion gas, such as, Ar or H or a combination of Ar and H, along paths 96 and 96A to a pocket or outlet 100A between exclusion ring 100, known as a MOER ring, described in U.S. Pat. Nos. 5,769,951 and 5,882,417 and indicated as related patents, which are incorporated herein in their entirety by their reference, and platen surface 63. The utility of the exclusion gas usage is known in the art to, in particular, keep depositions from the deposition gases from depositing along the edges as well as the underside of a workpiece positioned on platen surface 63.

As is known in the art, another tube in pedestal stem 74, which tube is not shown in FIG. 5, provides for a vacuum to be formed at aperture 97 and in grooves 99 in platen surface 93 which are beneath a workpiece positioned on platen surface 63 and hold the workpiece firmly on platen 63 during workpiece processing.

A feature of the embodiment of FIG. 5 is high performance heat shield 63 which comprises a high performance insulation 64, such as, for example, Microtherm®, Microsil®, and silica aerogel, which is welded in, or otherwise secured within, metal body or container 65. Container 65 may be comprised, for example, of stainless steel because of its low thermal conductivity. However, container 65 may be made of other metals or metal alloys. Stainless steel container 65 may, for example, have walls that are only eight-thousandths of an inch thick. Since the insulation is porous and contains air within a thin insulation lattice, a vent or vents 65A are formed around boss portion 63A of heat shield 63. These vents 65A permit any gas present in the interior of shield insulation 64 to be evacuated when the chamber of the semiconductor processing apparatus is pumped down to form a vacuum environment. When the apparatus chamber is evacuated, so will the porous interior of high performance insulation be correspondingly evacuated via vent 65A taking with it any lose micro-particles of the porous insulation through the evacuation port of the apparatus chamber so that they do not contaminate the processing carried out in the apparatus chamber. Vent 65A may be, for example, 10 µm sintered stainless steel where the sintering process renders the stainless steel porous forming vents 65A. Container 65 may, alternatively, be made of a nickel alloy.

Not only has testing shown that high performance heat shield 63 provides at least a 20% reduction in power consumption to be supplied to heater 62B but also the reduction in temperature of components, such as pedestal base 66, below heat shield 63, are at a temperature below 100° C. while the temperature at platen surface 63 is around 400° C. as provided by heater 62B. In prior pedestal assemblies of the current assignee herein where no such heat shield 63 was present, the temperature at pedestal base 66 is around 300° C. or more while the temperature at platen surface 63 is around 400° C. This is marked reduction of approximately 200° C. in temperature. In apparatus for depositing films, at temperature of around 100° C. at pedestal base 66 will permit very little deposition on exposed base surfaces forming, in most cases, a manometer-thin or an ultra-thin film through dissociation of any gas-entrained constituents. The deposition of such thin films render their removal much easier, in time and cleaning costs, via a cleaning process, such as, by etching. It has been calculated that reduction in amount of these unwanted depositions on base 66 will be more than 90% because of the employment of high performance heat shield 63.

In a particular application of high performance heat shield 63 comprising Microtherm® high temperature thermal insulation, such a high performance insulation has the following properties:

Thermal conductivity (ISO 8302, ASTM C177), as an example, for Microtherm® Super G at 320 kg/m3 density over a temperature range of 100° C. to 800° C. is shown in Table 1 below:

TABLE 1

0.0221 W/m · k at 100° C. mean
0.0222 W/m · k at 200° C. mean
0.0230 W/m · k at 300° C. mean
0.0244 W/m · k at 400° C. mean
0.0260 W/m · k at 500° C. mean TABLE 1-continued 0.0281 W/m · k at 600° C. mean
0.0343 W/m · k at 800° C. mean The thermal conductivity of alumina 99.9% employed for platen assembly 62A and heater 62B is 24 W/m·k It can be seen from the above data that the thermal conductivity of Microtherm® is fairly uniform over a wide range of temperatures utilized in semiconductor processing apparatus so that a significant power reduction of electrical energy is achieved for heater 62B while still meeting the temperature requirements for semiconductor workpiece processing at platen 62A.

Of particular interest with respect to the embodiment of FIG. 5 are two additional features. First, there is a cooling mechanism employing tube 90 within cavity 74A of stem 74 and, second, a purge gas feature employing tube or line 92 to purge paths 101, 102 and 103, where the latter two paths are formed on adjacent sides of heat shield 63 as seen in FIG. 5. In connection with the second mentioned feature, purge line 92 is coupled through the sidewall 74A of stem 74 to a cavity 91 formed between the shank portion of aluminum base 66 and stainless steel stem 74. A purge gas, such as $N_2$, is provide in conduit 92 to cavity 91 where the gas follows along annular path 101 and, thence, through purge paths 102 and 103 along adjacent sides of heat shield 63. The output for pressurized purge gas from paths 102 and 103 is provided at an annular purge gas exit or outlet at 104 between base 66 and a lower bottom portion of platen assembly 62A and heater 62B. This purging gas prevents deposition or cleaning (etching) gases from entering into the interior of pedestal assembly 60, such as between platen 62A, heater 62B, heat shield 63 and pedestal base 66. As just indicated, this pressurized purge gas prevents the entrance of deposition or cleaning gases from entering the pedestal assembly 62 between these components and, therefore, permits the use of component materials in pedestal assembly 60 that would normally be corroded by cleaning gases such as, for example, the stainless steel, thin-wall container 65 containing high performance insulation 64. As previously indicated, stainless steel is desirable as heat shield container material because of its relative low thermal conductivity compared to aluminum heater body 62. The deployment of the purge gas paths 102 and 103 on adjacent sides of container 65 readily permits the use of stainless steel without being corroded any chamber gases.

Relative to the first mentioned feature, an enhanced cooldown mechanism of the chamber of the semiconductor processing apparatus is achieved by providing a cavity 74A formed within thin-wall stainless steel stem 74 into which a compressed cooling gas, such as air, is provided through conduit or tube 90. A cooling gas supply line 90, an exclusion gas supply line 77 and a purge gas supply line 92 (as well as the vacuum line, not shown, to platen surface 63) are mounted within stem cavity 74A. Tube 90 is open at its upper end 90A adjacent to the upper end 74C of stem cavity 74 to permit forced air to flow out around and along the inside surfaces of stem 74 as indicated by arrows 108. When the power to heater elements 61 is turned off and cooldown of the apparatus chamber begins, the employment of the airflow 108 enhances the cooldown by rapidly carrying away the chamber heat via stem wall 74A and conveyed away by the air flow in cavity 74A to openings or apertures in end plate 82. Also, the conduits 77 and 92 as well as metal boss 59A in cavity 74A function as heat dissipating fins to provide additional surface area within stem cavity 74A for the removal of heat away from stem cavity and conduit surfaces and move the heated air out of stem 74 via the exit through the bottom of stem 74 through the openings in end plate 82. It is also within the scope of this cooldown mechanism to enhance cooldown further by the employment of additional cooling fins attached to the inner surface of the wall 74A of stem 74. Testing employing this cooldown mechanism has shown that cooldown of an apparatus heated to 400° C. can be cooldown to 100° C. in about one hour's time whereas, in the past without such a cooldown mechanism, it takes approximately four hours to reach the same 100° C. It readily can be seen, therefore, that a significant savings in time is obtained in reaching a temperature where the opening of the apparatus chamber is possible thereby providing, overall, less downtime of the apparatus and devoting additional time for semiconductor processing production.

Figure 5A:
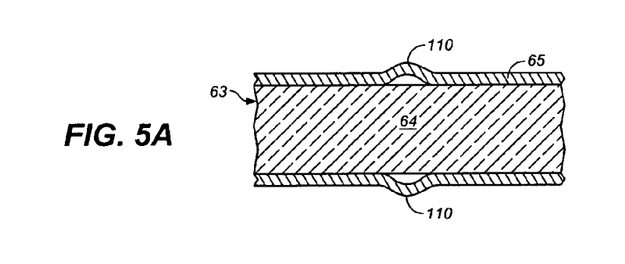
FIG. 5A is close-up view of a cross-sectional area of the heat shield of FIG. 5.

FIG. 5A is an enlarged cross section of high performance heat shield 63 of FIG. 5. As shown in this embodiment, the thin-wall metal container 65 may be provided with a pattern of protrusions 110 formed in its shell body. These protrusions 110 maintain a spaced relation between adjacent sides of shield 63, respectively, from heater assembly 62B and base 66, so that the spacing forming purge paths 102 and 103 is maintained along the longitudinal surfaces of these components from their center and radially outward to their edges to annular outlet 104 into the apparatus chamber. Protrusions 110 may be placed in a random pattern for deflecting, diffusing, redirecting and diverting the purge gas flow between these component surfaces in paths 102 and 103 to provide for a more uniform gas purge flow around the paths 101 and 102 to their exit point 104 into the apparatus chamber.

Also, it should be noted that the protrusions 110 minimize physical metal-to-metal contact between surfaces of heater 62A and heat shield 63 so that heat conduction from heater 62A to heat shield 63 is even further minimized by this spaced relation and minimal surface contact between the surfaces of these two components.

Examples of protrusions 110 are a pattern of dimples formed in the metal of insulation container 65, formed by means of press rolling of the metal container walls, or they may be formed as ridges in the metal of insulation container 65 that extend out in a radial pattern from the center of heat shield 63 as a single radial group of annular-formed ridges or as multiple radial groups of annular-formed ridges. In the case of multiple radial groups, the groups of ridges extend from a first group near the center of shield 63 to a next group of annular ridges further out from the center and so on. In this embodiment, radial extended group has its annular-extending ridges offset from the previous and next-succeeding group of annular-extending ridges in order to deflect, diffuse, redirect and divert the purge gas flow between the heater/shield surfaces in paths 102 and 103 resulting in a more uniform gas purge flow around paths 102 and 103 to their exit point 104 into the apparatus chamber.

The foregoing description of the present invention has been provided for purposes of clarity and understanding. The description is not, therefore, intended to limit the present invention to the precise form disclosed. Various modifications to that description are possible without departing from the scope of the present invention or the range of equivalence appropriate thereto.

What is claimed is:

1. A method of enhancing the efficiency of a semiconductor processing apparatus having a processing chamber within which is supported at least one heater for heating a workpiece supported relative to a first side of the heater, comprising:
   providing a heater for heating the workpiece in the chamber for treatment in the chamber via a power source to heat the workpiece to a predetermined temperature;
   forming a heat shield having first side adjacent to a second side of the heater so that a substantial temperature differential is established between the heater and a second side of the heat shield;

selecting a high performance insulation for the heat shield having a thermal conductivity below that of still air over a predetermined temperature range to reduce power required to heat the workpiece to the predetermined temperature;

covering the heat shield insulation with a metallic shell;

providing protrusions on an outer surface of the metallic shell to maintain spacing between the metallic shell and the second side of the heater;

flowing purge gas between the metallic shell and the second side of the heater during operation of the heater;

providing a vent to the metallic shell; and evacuating the metallic shell by evacuating the processing chamber prior to workpiece treatment.

2. The method of claim 1 where the selecting includes selecting high performance insulation having a thermal conductivity within the range of about 0.004 W/m·h to about 0.4 W/m·h.

3. The method of claim 1 wherein the high performance insulation is selected from the group of materials known as Microthem®, Microsil®, and silica aerogels.

4. The method of claim 1 further comprising:

depositing a film on the workpiece via a gas entrained constituent supplied to the chamber; and selecting a high performance insulation to provide a large temperature differential between the first and second sides of the heat shield to minimize the deposition of gas-entrained constituents on portions of the chamber adjacent and beyond the second side of the heat shield.

\* \* \* \* \*

UNITED STATES PATENT AND TRADEMARK OFFICE
CERTIFICATE OF CORRECTION

PATENT NO. : 8,753,447 B2  
APPLICATION NO. : 12/482042  
DATED : June 17, 2014  
INVENTOR(S) : Lind et al.

Page 1 of 1

It is certified that error appears in the above-identified patent and that said Letters Patent is hereby corrected as shown below:

On the Title Page

Item (56), Column 2,  
Other Publication, Line 1:   Delete "coductivity" and insert --conductivity--

In the Specification

Column 6, Line 22:   Delete "Ill-V" and insert --III-V--

Column 7, Line 25:   Delete "16" and insert --18--

In the Claims

Column 15, Claim 3,  
Line 20:   In Claim 3, delete "Microthem®" and insert --Microtherm®--

Signed and Sealed this  
Tenth Day of February, 2015

Michelle K. Lee  
*Deputy Director of the United States Patent and Trademark Office*